United States Patent
Kase et al.

(10) Patent No.: US 7,358,796 B2
(45) Date of Patent: Apr. 15, 2008

(54) INPUT CIRCUIT FOR RECEIVING A VARIABLE VOLTAGE INPUT SIGNAL AND METHOD

(75) Inventors: Kiyoshi Kase, Austin, TX (US); May Len, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 75 days.

(21) Appl. No.: 11/530,181

(22) Filed: Sep. 8, 2006

(65) Prior Publication Data
US 2008/0061846 A1   Mar. 13, 2008

(51) Int. Cl.
*G05F 1/10* (2006.01)
*G05F 3/02* (2006.01)

(52) U.S. Cl. ............... 327/538; 327/543; 327/563; 330/252

(58) Field of Classification Search ........ 327/108–112, 327/538, 540–543, 545, 546, 560–563; 326/82–84, 326/86, 89, 90; 330/252, 253
See application file for complete search history.

(56) References Cited

U.S. PATENT DOCUMENTS

| | | | | |
|---|---|---|---|---|
| 5,198,780 | A | * | 3/1993 | Kase .................... 330/254 |
| 5,708,376 | A | * | 1/1998 | Ikeda ..................... 327/50 |
| 6,998,907 | B1 | | 2/2006 | Kindt et al. |
| 7,202,738 | B1 | * | 4/2007 | Huijsing et al. ......... 330/253 |
| 2007/0279130 | A1 | * | 12/2007 | Furuta .................... 330/253 |

* cited by examiner

*Primary Examiner*—Tuan T. Lam
*Assistant Examiner*—Patrick O'Neill
(74) *Attorney, Agent, or Firm*—Robert L. King; Ranjeev Singh

(57) ABSTRACT

An input voltage circuit comprises an input transistor having a control electrode for receiving a variable input voltage, a voltage detection transistor having a current electrode coupled to a current electrode of the input transistor forming a first node, and a current source coupled to a second current electrode of the voltage detection transistor forming a second node. The input voltage circuit further comprises a variable voltage drop transistor having a first current electrode coupled to the first node, a control electrode coupled to the second node and a second current electrode coupled to an output node, wherein the voltage detection transistor detects a variation in the variable input voltage and provides a signal to the variable voltage drop transistor. The variable voltage drop transistor generates a voltage drop proportional to the variation in the variable input voltage to ensure a substantially constant output at the output node.

20 Claims, 5 Drawing Sheets

INPUT CIRCUIT FOR RECEIVING A VARIABLE VOLTAGE INPUT SIGNAL AND METHOD

FIELD OF THE INVENTION

This invention relates generally to semiconductors, and more specifically, to semiconductor circuits for receiving input signals.

BACKGROUND OF THE INVENTION

Signal processing devices typically utilize an input circuit to interface between a first circuit or device and a processor. A common format of an input signal is known as a differential signal. A differential signal has its information content expressed by a difference either in phase or magnitude of two signals.

For example, in one form a differential signal pair may be two square wave signals that differ one hundred eighty degrees in phase and which transition between zero and two volts. In this example the common mode voltage of the differential signal pair is one volt.

As various consumer wireless products, such as pagers, telephones, etc. developed there has been inconsistency in the industry as to what voltages were used for the information signals. In particular, differential signal inputs for existing wireless products typically have a wide variety of voltages. For example some products transmit a differential signal having a low common mode voltage such as 0.2 volt. Other products transmit a differential signal having a significant higher common mode voltage value such as 1.5 volts. As a result of the potential of receiving a wide range of input signal voltages, the input transistors must be physically sized to be large enough to receive the largest expected voltage and not be damaged. However, the large sizing of the input transistors results in slower switching speeds for those transistors. Also, existing common mode input circuits usually exhibit the characteristic that if their inputs receive differing common mode voltages, the output voltage that such input circuits provide will also vary. The resulting variation of the output voltage limits the range of the output signal of the input signal because the minimum voltage of the output signal is proportional to the common voltage input. A limitation in the range of the output signal results in lost resolution and accuracy.

BRIEF DESCRIPTION OF THE DRAWINGS

The present invention is illustrated by way of example and not limited to the accompanying figures, in which like references indicate similar elements.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

Figure 1:
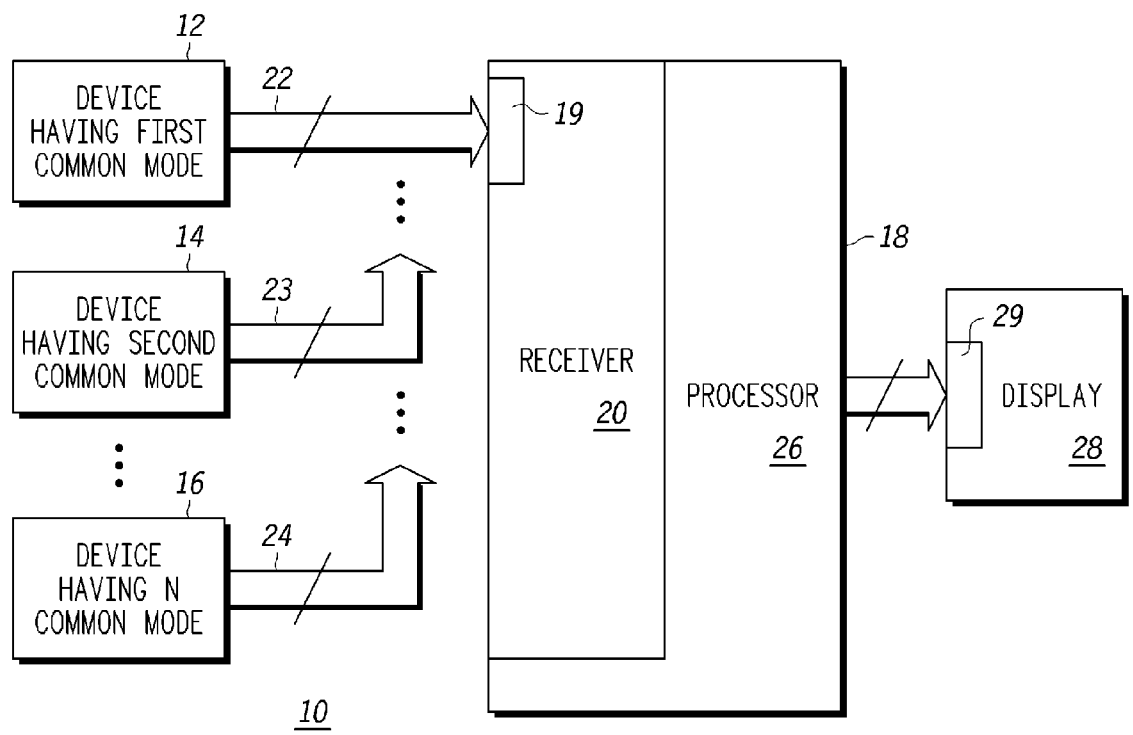
FIG. 1 illustrates in block diagram form one example of an application environment for an input circuit that uses common mode inputs.

Illustrated in FIG. 1 is an application environment 10 which is exemplary of a use of an input circuit. A device 12 having a first common mode output voltage is coupled to an input port 19 of an integrated circuit 18 via a multiple conductor transmission medium 22. The input port 19 is an input to a receiver 20 of the integrated circuit 18. The integrated circuit also contains at least a processor 26 for processing information associated with the first common mode output and other inputs received at the input port 19. A device 14 having a second common mode output voltage is selectively coupled to the input port 19 via a multiple conductor transmission medium 23. In one form the device 12 is physically disconnected from the input port 19 and the device 14 is connected to input port 19. Any other number of N devices, where N is an integer, are connected one-at-a-time to input port 19. In the illustrated form a device 16 having an Nth common mode output voltage is selectively connected to the input port 19 via the transmission medium 24. Devices 12, 14 and 16 may be implemented as any of various types of devices. For example, devices 12, 14 and 16 may be a personal digital assistant (PDA), a cellular telephone, a camera, or any other type of transmitter. The integrated circuit 18 has one or more multiple conductor outputs that are connected to an input port 29 of a display 28 for displaying in some form the information received from any of the devices 12, 14 and 16. In one form some or all of the devices 12, 14 and 16 may be implemented as wireless devices and thus the illustrated transmission mediums 22-24 may not be needed as the wireless devices could transmit a common mode differential signal to the integrated circuit 18. Because there is a wide variety of types of devices that interface with the integrated circuit 18, there will also be a wide variety in the voltage values of the differential input signals that are received. Thus the received common mode voltages will also vary. It is important however, that a single input circuit be used by receiver 20 that can receive these various common mode input voltages without being damaged and provide a resulting signal to processor 26 that has a full range of defined signal values.

Figure 2:
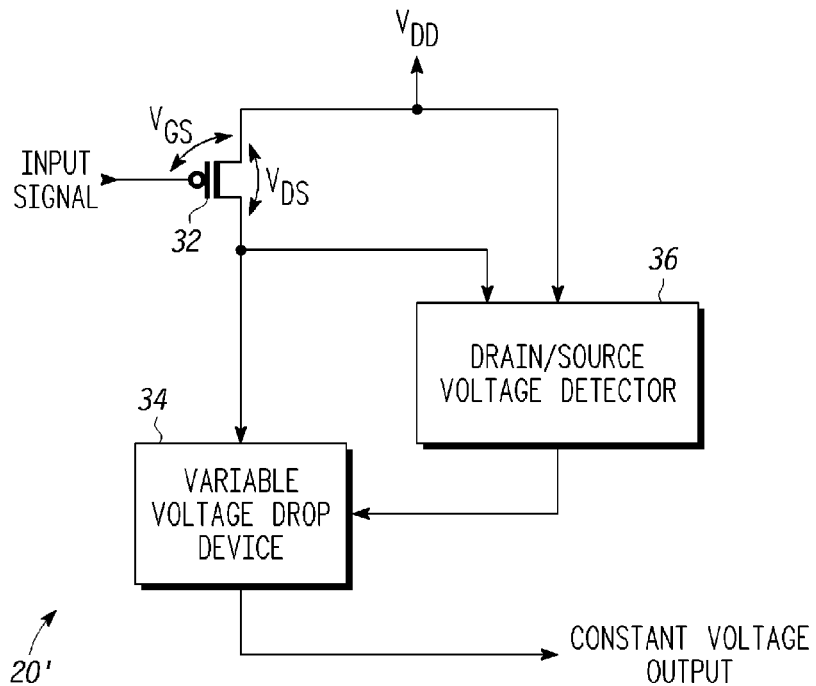
FIG. 2 illustrates in block diagram form an input circuit in accordance with the present invention.

Illustrated in FIG. 2 is a block diagram of a portion 20' of the receiver 20 that contains an input circuit in accordance with one form of the present invention. A P-channel transistor 32 has a source connected to a positive power supply voltage terminal for receiving a power supply voltage $V_{DD}$. A gate of transistor 32 is connected to an input signal labeled "INPUT SIGNAL". A drain of transistor 32 is connected to an input of a variable voltage drop device 34 and to a first input of a drain/source voltage detector 36. A second input of the drain/source voltage detector 36 is connected to the source of transistor 32. An output of the drain/source voltage detector 36 is connected to a second input of the variable voltage drop device 34. An output of the variable voltage drop device 34 provides a constant voltage output signal labeled "CONSTANT VOLTAGE OUTPUT". Between the gate and source of transistor 32 is developed a gate-tosource voltage labeled "$V_{GS}$". Across the drain and source of transistor 32 is developed a drain-to-source voltage labeled "$V_{DS}$".

In operation, an input signal is received by portion 20' which will bias transistor 32 to either be conductive or non-conductive. The variable voltage drop device 34 will function to vary the amount of voltage that is dropped between its input and output so that the output voltage provided remains the same or is constant. In order to accomplish this function, the output of the drain/source voltage detector 36 functions as a control signal that is input to the variable voltage drop device 34. The control signal that is applied to the variable voltage drop device 34 from the drain/source voltage detector 36 functions to modify the conduction of the variable voltage drop device 34. Modifying the conduction of the variable voltage drop device modifies the amount of voltage which exists across the variable voltage drop device 34. In particular, the voltage value of the input signal directly changes the value of $V_{GS}$ and $V_{DS}$. If a relatively small input signal voltage is received, the drain-to-source voltage of transistor 32 will remain below a transistor threshold. The drain/source voltage detector 36 detects the value of $V_{DS}$ being below a transistor threshold and thus will apply a $V_{DD}$ to the variable voltage drop device 34. The conductance of the variable voltage drop device 34 is placed at a maximum value so that the voltage drop across variable voltage drop device 34 is very small. If a relatively large input signal voltage is received, the drain-to-source voltage of transistor 32 will increase above a transistor threshold. In response, the drain/source voltage detector 36 applies a decreased bias voltage to the variable voltage drop device 34 which decreases the conduction of variable voltage drop device 34. The decreased conduction of variable voltage drop device 34 increases the voltage drop across variable voltage drop device 34 which permits the output voltage of variable voltage drop device 34 to remain constant even though the input signal and $V_{DD}$ has increased in value. Thus portion 20' has provided an effective method to implement an input circuit that provides a constant voltage output in response to the presence of an input signal, even though the input signal may substantially vary in voltage value. It should be noted that transistor 32 is implemented as a low voltage transistor to effectively receive a variety of gate voltages without a decrease in speed of operation of the circuit.

It should be noted that the drain/source voltage detector 36 and the variable voltage drop device 34 function together to protect transistor 32 from the presence of a large $V_{DS}$ caused by a large voltage input signal. It should also be noted that each of the variable voltage drop device 34 and the drain/source voltage detector 36 may each be implemented with one or more transistors and/or transistors in combination with other semiconductor elements.

Figure 3:
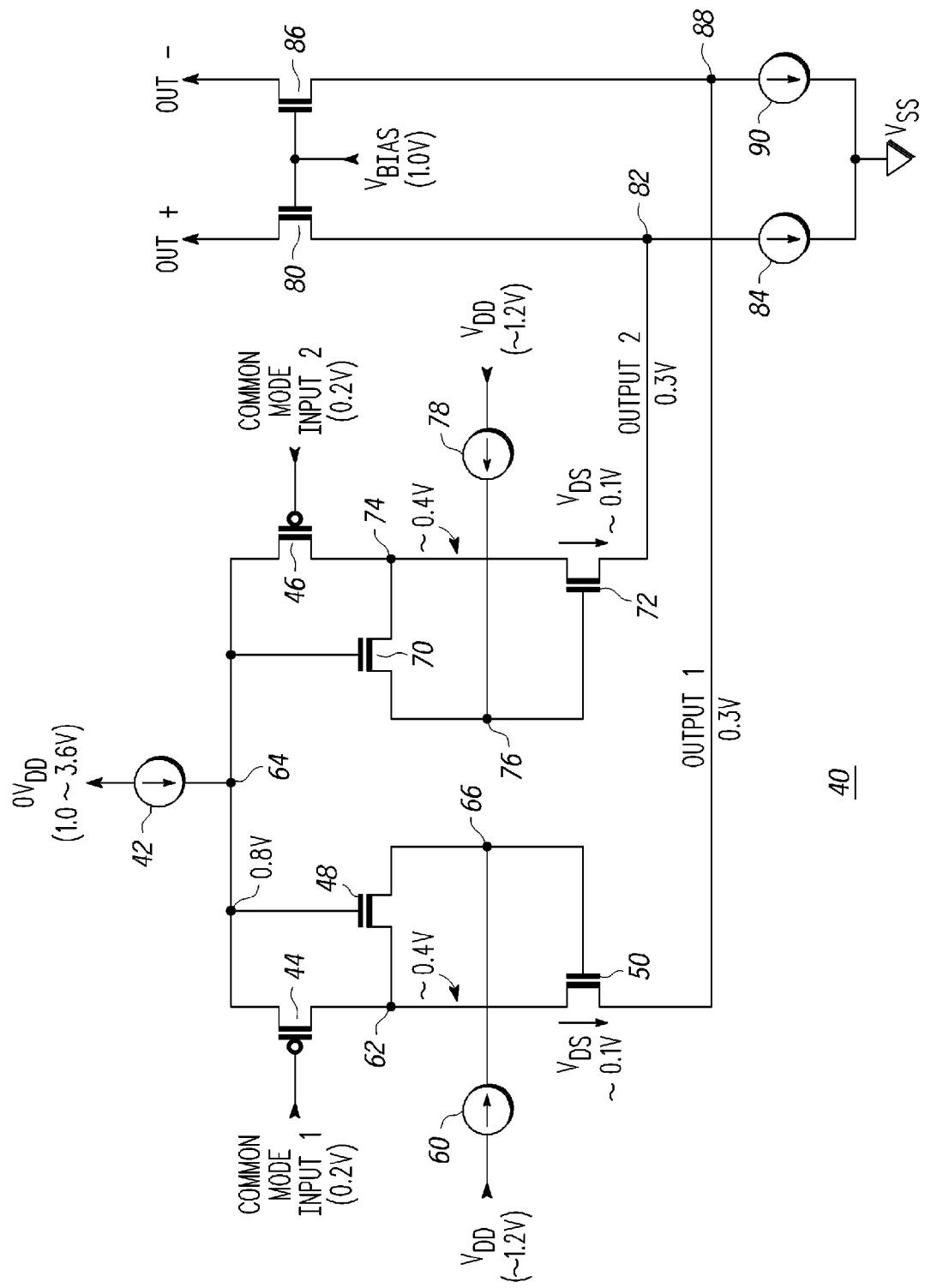
FIG. 3 illustrates in block diagram form a common mode input example of the input circuit of FIG. 2 having a first example of operating voltages.

Illustrated in FIG. 3 is a common mode input circuit 40 for receiving two common mode input signals that may vary between voltage levels based on the source of the common mode input signals. The primary variation being discussed herein results from the common mode signal for some originations being as low as 0.2 volt and as high as 1.5 volts or higher, even though the common mode signal may vary somewhat due to noise sources and processing variations regardless of what voltage value is presented. For applications where the voltage value of the common mode input is known, the value of the supply voltage may be sized appropriately. In the illustrated form a current source 42 has a first terminal connected to a terminal for receiving an Input/Output (I/O) supply voltage output labeled $OV_{DD}$. As described below the value of $OV_{DD}$ is fixed but will have a value determined by the value of expected common mode inputs. In the examples provided herein the value of $OV_{DD}$ may be set anywhere from one volt to 3.6 volts but is implementation dependent. A second terminal of current source 42 is connected to a source of a P-channel transistor 44 and to a source of a P-channel transistor 46 at a node 64. A gate of transistor 44 is connected to a terminal for receiving a first common mode input 1, and a gate of transistor 46 is connected to a terminal for receiving a second common mode input 2. A drain of transistor 44 is connected to a source of an N-channel transistor 48. A gate of transistor 48 is connected to the source of transistor 44. A drain of transistor 48 is connected at a node 66 to a gate of an N-channel transistor 50. A drain of transistor 50 is connected to a drain of transistor 44. A first terminal of a current source 60 is connected to a supply voltage terminal for receiving a core supply voltage labeled $V_{DD}$. The core supply voltage $V_{DD}$ is a voltage typically associated with circuitry in a processor and is lower than the supply voltage $OV_{DD}$ which is associated with circuitry at an input/output interface. A source of transistor 50 provides a first output labeled "Output 1" that is connected to a node 88. An N-channel transistor 70 has a gate connected to a source of transistor 46 at node 64. A source of transistor 70 is connected at a node 74 to a drain of transistor 46 and to a drain of an N-channel transistor 72. A drain of transistor 70 is connected at a node 76 to a gate of transistor 72. A first terminal of a current source 78 is connected to the core supply voltage $V_{DD}$. A second terminal of current source 78 is connected to the node 76. A source of transistor 72 provides a second output labeled "Output 2" and is connected to a node 82. An N-channel transistor 80 has a drain for providing a first differential output labeled "OUT+". An N-channel transistor 86 has a drain for providing a second differential output labeled "OUT−". A gate of transistor 80 is connected to a gate of transistor 86 for receiving a bias voltage labeled "$V_{BIAS}$". A source of transistor 80 is connected to a first terminal of a current sink 84. A source of transistor 86 is connected to a first terminal of a current sink 90. A second terminal of current sink 84 and a second terminal of current sink 90 is connected to a terminal for receiving a supply voltage labeled $V_{SS}$. In one form the $V_{SS}$ supply voltage is a ground reference terminal.

For convenience of explanation, common mode input circuit 40 also has included thereon exemplary operating voltage values. It should be understood that these voltage values are exemplary only and differ from implementation to implementation based upon processing parameters and device sizing. In the illustrated example, assume that the common mode voltage received at each input terminal is 0.2 volt. If only common mode voltages of this value are received the value of $OV_{DD}$ may be 1.0 volt. To accommodate input common mode voltages that may up to 2.5 volts, a value of $OV_{DD}$ of approximately 3.6 volts should be used. Therefore, depending upon the anticipate values of the common mode input voltage a range of $OV_{DD}$ supply voltages from 1.0 to 3.6 may be implemented. An example of the common mode input of 0.2 volt is an input that is a square wave pulse varying from 0.0 volt to 0.4 volt. In such an example the first input differs from the second input by being out of phase by one hundred eighty degrees. Assume also that the value of supply voltage $OV_{DD}$ is constant but is some value within a range of 1.65 volts to 3.1 volts. With a gate voltage of 0.2 volt on transistor 44, the source of transistor 44 is at 0.8 volt assuming that the $V_{GS}$ of transistor 44 is 0.6 volt. Also assume that the value of the drain-tosource voltage of transistor 44 is approximately 0.4 volt. Therefore the voltage at node 62 is 0.4 volt if the voltage at node 64 is 0.8 volt. Because the threshold voltage of transistor 48 is about 0.6 volt, under these bias conditions transistor 48 is not conductive. As a result, the gate of transistor 50 is not connected to its drain via transistor 48. Transistor 50 is biased from current source 60 which is connected to a $V_{DD}$ of 1.2 volt. Therefore, transistor 50 is biased to be very conductive and have low resistivity. At this conductivity, the $V_{DS}$ of transistor 50 is only 0.1 volt. Since node 62 is at 0.4 volt, the source of transistor 50 is at 0.3 volt. It should be noted that voltages associated with transistors 46 and 72 and node 74 are analogous to the voltages associated with transistors 44 and 50 and node 62 described above. As a result both Output 1 and Output 2 are at 0.3 volt. The source of each of transistor 50 and transistor 72 remains at a constant output voltage of 0.3 volt primarily as a result of the biasing of transistors 80 and 86 to respectively maintain nodes 82 and 88 at a fixed potential. The function of transistors 80 and 86 and current sinks 84 and 90 is to amplify the Output 1 and Output 2 signals and provide Out+ and Out− as increased voltage signals. The drains of transistors 80 and 86 are respectively labeled with a plus and a negative signal but they are not necessarily positive and negative signals. These two signals may be differential signals by having the same voltage and polarity but having different phases.

Figure 4:
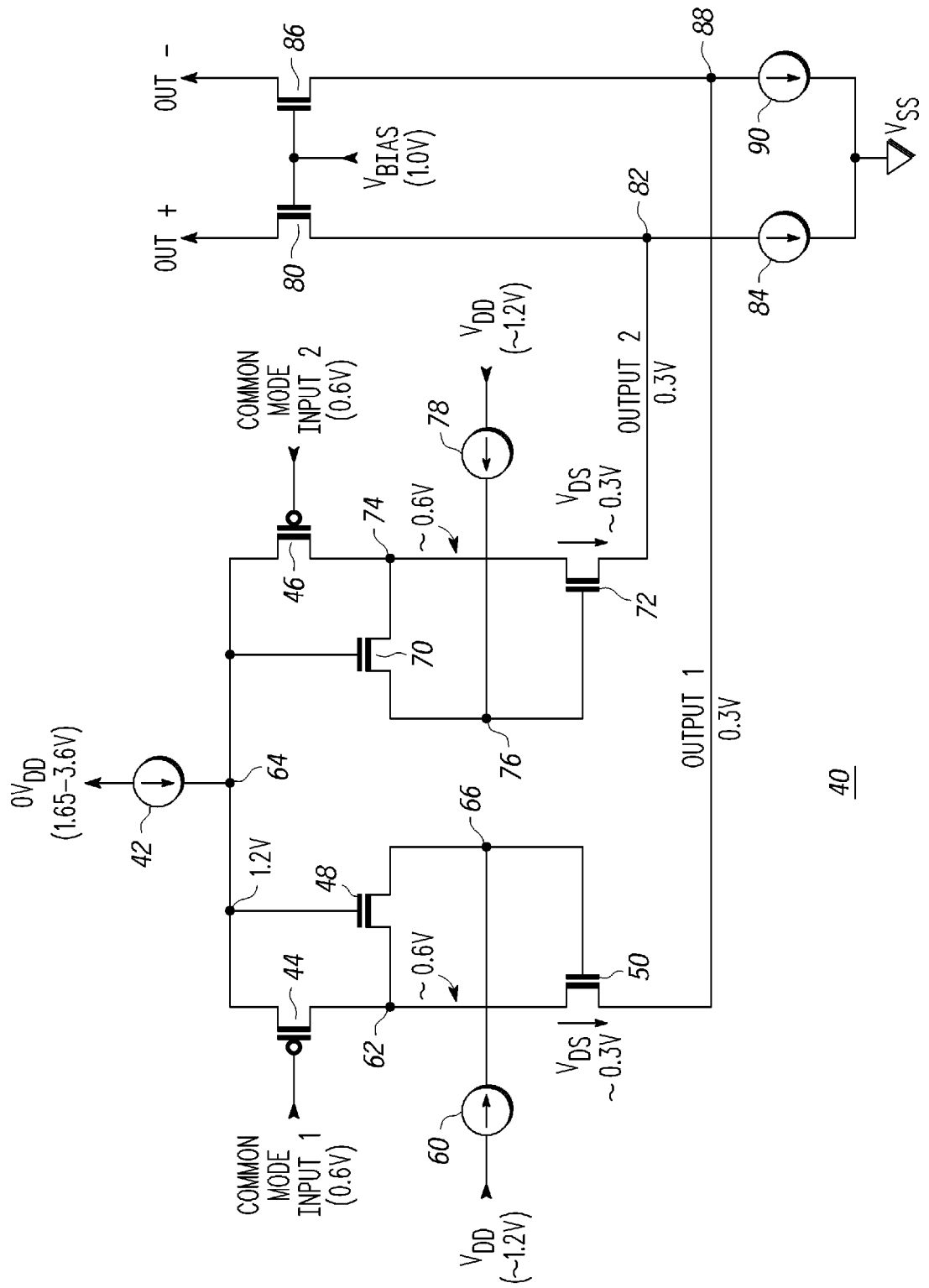
FIG. 4 illustrates in block diagram form a common mode input example of the input circuit of FIG. 2 having a second example of operating voltages.

Illustrated in FIG. 4 is a reproduction of common mode input circuit 40 of FIG. 3 having different common mode input voltage inputs. No structural change between FIG. 3 and FIG. 4 exists. As a result of an increase in the common mode input voltages to 0.6 volt, the previously discussed voltages change as noted in FIG. 4. Because the gate-to-source voltage of each of transistor 44 and transistor 46 is 0.6 volt, the voltage at node 64 is 1.2 volt. Because the $V_{DS}$ of each of transistors 44 and 46 is 0.6 volt, each of nodes 62 and 74 is at 0.6 volt. The $V_{GS}$ of each of transistors 48 and 70 is 0.6 volt. Therefore, each of these transistors is weakly conductive. As a result, nodes 66 and 76 have a value that is between $V_{DD}$ minus the voltage drop respectively across the current sources 60 and 78. With the illustrated voltages, node 66 will be greater than node 62. Similarly, node 76 will be greater than node 74. Nodes 66 and 76 therefore bias transistors 50 and 72 to be less conductive than in the voltage operation of FIG. 3. As a result, transistors 50 and 72 have a higher $V_{DS}$ (i.e. a higher voltage drop) than in the prior voltage operation example. However, the source of transistor 50 and 72 remains at a constant output voltage of 0.3 volt primarily as a result of the biasing of transistors 80 and 86.

Figure 5:
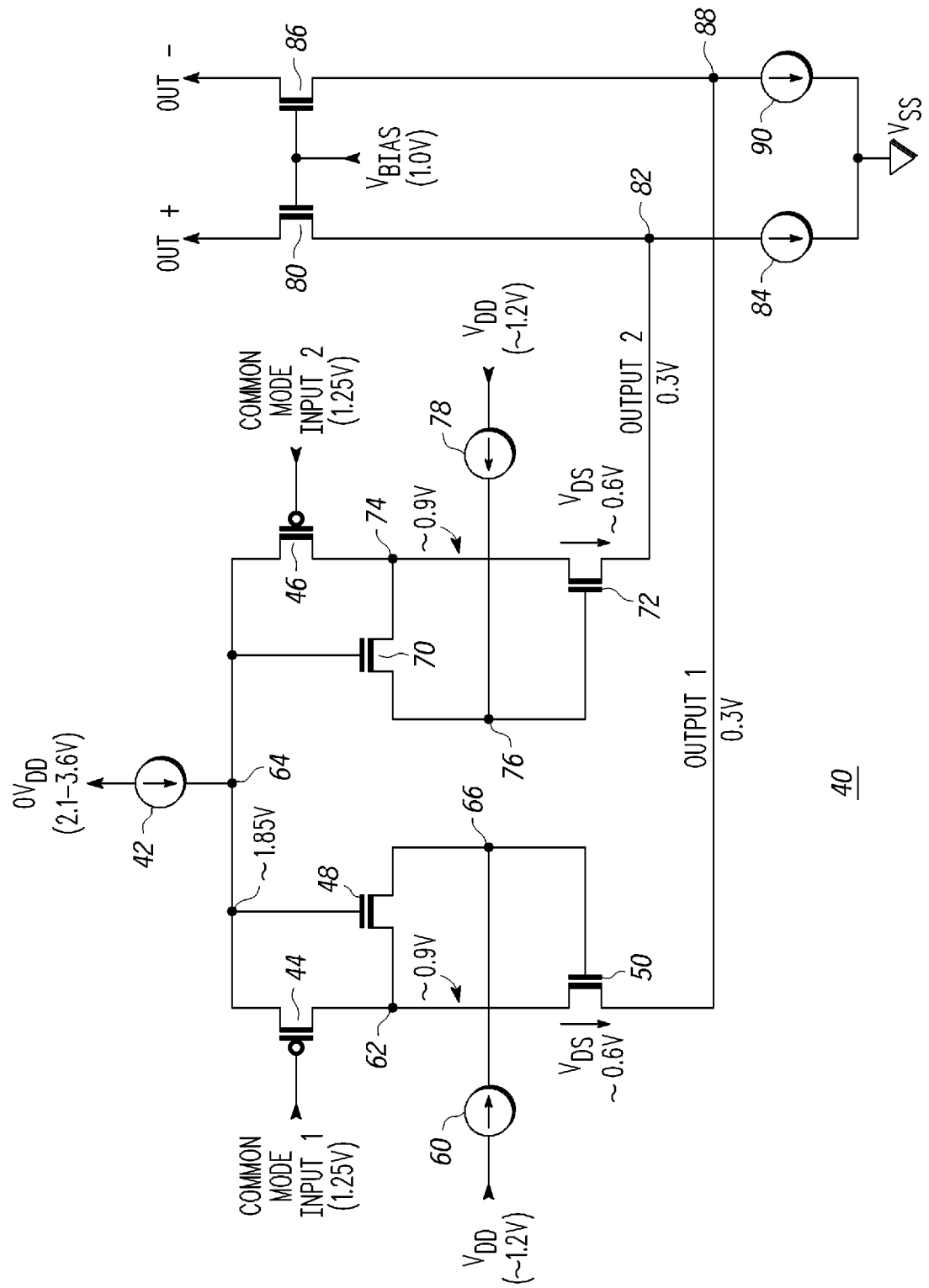
FIG. 5 illustrates in block diagram form a common mode input example of the input circuit of FIG. 2 having a third example of operating voltages.

Illustrated in FIG. 5 is a reproduction of common mode input circuit 40 of FIG. 3 again having different common mode input voltage inputs. As with FIG. 4, no structural changes to common mode input circuit 40 from FIG. 3 have been made and therefore the reference element numbers are not changed from the previous drawings. As a result of an increase in the common mode input voltage to 1.25 volts, the previously discussed voltages again change as noted in FIG. 5. Because the gate-to-source voltage of each of transistor 44 and transistor 46 is 0.6 volt, the voltage at node 64 is approximately 1.85 volts. With a bias voltage of 1.25 volts applied to the gate of the P-channel transistor 44, the transistor 44 is strongly nonconductive and thus highly resistive. As a result of having a higher resistivity, transistor 44 has a higher $V_{DS}$ (i.e. a higher voltage drop) than in the prior voltage operation example. Under the bias conditions of FIG. 5, the $V_{DS}$ of each of transistors 44 and 46 is approximately 0.95 volt. Therefore, each of nodes 62 and 74 is at approximately 0.9 volt rather than 1.25 volts due to the strong non-conduction of transistors 44 and 46, respectively. The $V_{GS}$ of each of transistors 48 and 70 is 0.6 volt and each of these transistors is strongly conductive. Nodes 66 and 76 each have a voltage potential that is between $V_{DD}$ minus the voltage drop respectively across the current sources 60 and 78. With the illustrated voltages, node 66 will be greater in voltage potential than node 62. Similarly, node 76 will be greater in voltage potential than node 74. Transistors 48 and 70 function in combination with current sources 60 and 78, respectively, to detect voltage changes in the drain-to-source voltage of transistors 44 and 46, respectively. As a result, the bias voltage at each of nodes 66 and 76 changes to respectively vary the voltage drop across transistors 50 and 72 as a function of variation in the input common mode voltage. In the example of FIG. 5, nodes 66 and 76 therefore respectively bias transistors 50 and 72 to be less conductive than in the voltage operation of FIGS. 3 and 4. As a result, transistors 50 and 72 are more resistive and have a higher $V_{DS}$ (i.e. a higher voltage drop) than in the prior voltage operation example. However, the source of each of transistors 50 and 72 remains at a constant output voltage of 0.3 volt primarily as a result of the biasing of transistors 80 and 86. It should be noted that the combination of transistors 50 and 48 protect transistor 44 from having a $V_{DS}$ that exceeds a voltage high enough in voltage that the integrity of the gate oxides of transistors 44 and 46 are threatened. As a result, all of the illustrated transistors in common mode input circuit 40 are implemented with low voltage gate oxide thicknesses which enables the input circuit 40 to have fast switching transistors. To interface with the higher $OV_{DD}$ supply voltage of up to 3.6 volts only the transistor that implements current source 42 needs to be implemented as a high voltage device with a much thicker gate oxide. The implementation of the transistor in current source 42 as a high voltage device does not however slow the operation of input circuit 40.

Figure 6:
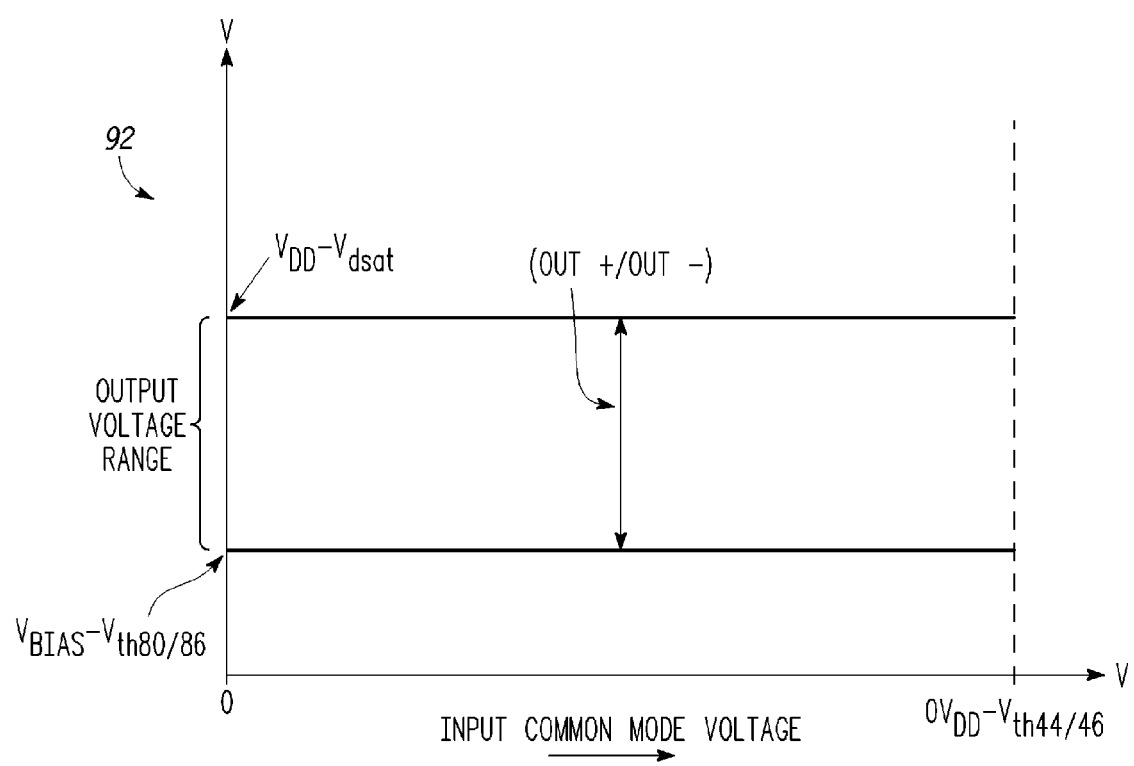
FIG. 6 illustrates in graphical form the constant value of differential output signals of the input signal over a range of common mode input voltages.

Illustrated in FIG. 6 is a graph 92 that illustrates that for any voltage that is selected as the input common mode voltage, a constant and non-varying output voltage (Out+ or Out−) is provided. The actual voltage of the constant output voltage may differ from implementation to implementation as a result of semiconductor processing variation. This variation is illustrated in FIG. 6 as an output voltage range. A minimum value that the constant output voltages Out+ and Out− may assume is the value of bias voltage $V_{BIAS}$ minus the transistor threshold voltage, Vth, of either transistor 80 or transistor 86. However, it should be noted that the constant output voltage may assume a different voltage depending upon processing parameters and variations. A maximum voltage within the range of permissible constant voltages is the difference between the internal or core power supply voltage $V_{DD}$ and the drain saturation voltage, $V_{dsat}$, of the implemented transistors (i.e. the drain-to-source voltage of a transistor for the transistor to be in saturation mode of operation—this voltage has been assumed herein to be 0.6 volt but is process technology dependent). Regardless of what value within the output voltage range results, the output voltage remains constant in spite of a varying common mode input voltage. The horizontal axis of graph 92 represents common mode voltages from zero to the I/O supply voltage $OV_{DD}$ minus the threshold voltage of either transistor 44 or transistor 46. Regardless of the processing used to implement input circuit 40, a constant valued output voltage is provided even though the common mode input voltage changes. This fact is represented by the constant nature of both the minimum and maximum values defining the output voltage range.

By now it should be appreciated that there has been provided a wide common mode voltage circuit using low voltage transistors (i.e. transistors having small gate oxide thickness). The size of the small gate oxide is process dependent and will vary from implementation to implementation. In any implementation, the low voltage transistors are physically smaller and faster than the high voltage transistor used to implement current source 42. As a result of the use of low voltage transistors, fast transistor switching is provided. The fast operation is particularly useful in communication applications such as for receivers. The phrase 'wide common mode voltage' refers to the operational ability of the circuit to operate at any of a variety of differing voltage potentials for received input voltage. These differing voltage potentials are commonly coupled from differing devices that use differing valued power supply voltages.

In the foregoing specification, the invention has been described with reference to specific embodiments. However, one of ordinary skill in the art appreciates that various modifications and changes can be made without departing from the scope of the present invention as set forth in the claims below. For example, transistors other than MOS transistors may be used to implement the method of operation described herein. As process technologies change, various voltages other than the voltages described herein may be used. The current sources illustrated may be implemented as one or multiple transistors. Various applications other than in a receiver may be used with the method and circuitry described herein. In one form there has been provided an input voltage circuit in which a first input transistor has a control electrode for receiving a variable common mode input voltage. A first voltage detection transistor has a first current electrode coupled to a first current electrode of the first input transistor forming a first node. A first current source is coupled to a second current electrode of the first voltage detection transistor to form a second node. A first variable voltage drop transistor has a first current electrode coupled to the first node, a control electrode coupled to the second node and a second current electrode coupled to a first output node. The first voltage detection transistor detects a variation in the variable common mode input voltage and provides a signal to the first variable voltage drop transistor such that the first variable voltage drop transistor generates a voltage drop substantially proportional to the variation in the variable common mode input voltage to ensure a substantially constant output at the first output node. A second input transistor has a control electrode for receiving the variable common mode input voltage. A second voltage detection transistor has a first current electrode coupled to a first current electrode of the second input transistor to form a third node. A second current source is coupled to a second current electrode of the second voltage detection transistor to form a fourth node. A second variable voltage drop transistor has a first current electrode coupled to the third node, a control electrode coupled to the fourth node and a second current electrode coupled to a second output node. The second voltage detection transistor detects a variation in the variable common mode input voltage and provides a signal to the second variable voltage drop transistor such that the second variable voltage drop transistor generates a voltage drop substantially proportional to the variation in the variable common mode input voltage to ensure a substantially constant output at the second output node.

In another form the second node and the fourth node are coupled to a core voltage supply terminal for an integrated circuit that includes the input voltage circuit. In yet another form a fifth node is formed by a coupling of a second current electrode of the first input transistor, a control electrode of the first voltage detection transistor and a first terminal of an input/output voltage supply current source. A second terminal of the input/output voltage supply current source is coupled to an input/output voltage supply terminal. In yet another form a second current electrode of the second input transistor and a control electrode of the second voltage detection transistor are coupled to the fifth node. In another form the input/output voltage supply current source is formed with at least one thick-oxide transistor. In another form the input/output voltage supply terminal is coupled to a voltage supply in a range between 1.0 volt to 3.6 volts. In yet another form the first output node is coupled to a first current electrode of a first output transistor, and a second current electrode of the first output transistor is coupled to a first differential output terminal of the input voltage circuit. In yet another form the second output node is coupled to a first current electrode of a second output transistor, and a second current electrode of the second output transistor is coupled to a second differential output terminal of the input voltage circuit. In another form the input voltage circuit generates a differential output signal between the first differential output terminal and the second differential output terminal such that despite variations in the variable common mode input voltage the differential output signal stays within a range defined by a substantially fixed bottom range value and a top range value having a value that is within the range.

In yet another form there is provided an input voltage circuit having an input transistor having a control electrode for receiving a variable input voltage. A voltage detection transistor has a first current electrode coupled to a first current electrode of the input transistor forming a first node. A current source is coupled to a second current electrode of the voltage detection transistor forming a second node. A variable voltage drop transistor has a first current electrode coupled to the first node, a control electrode coupled to the second node and a second current electrode coupled to an output node, wherein the voltage detection transistor detects a variation in the variable input voltage and provides a signal to the variable voltage drop transistor such that the variable voltage drop transistor generates a voltage drop proportional to the variation in the variable input voltage to ensure a substantially constant output at the output node. In another form the first node is coupled to a core voltage supply terminal for an integrated circuit that includes the input voltage circuit. In yet another form a third node is formed by a coupling of a second current electrode of the input transistor, a control electrode of the voltage detection transistor and a first terminal of an input/output supply voltage current source. A second terminal of the input/output supply voltage current source is coupled to an input/output voltage supply terminal. In another form the input/output supply voltage current source is formed of at least one thick-oxide transistor. In yet another form the output node is coupled to a first current electrode of an output transistor, and a second current electrode of the first output transistor is coupled to an output terminal of the input voltage circuit. In yet another form the input voltage circuit generates an output signal at the output terminal of the input voltage circuit such that despite variations in the variable input voltage the output signal stays substantially constant.

There is also provided a method for providing a substantially constant output signal at an output node of an input voltage circuit. The input voltage circuit includes an input device having a first terminal for receiving a variable input voltage, a voltage detection device having a terminal coupled to a second terminal of the input device forming a first node, and a variable voltage drop device having a first terminal coupled to the first node, and a second terminal coupled to the output node. At least the voltage detection device is used to detect a variation in the variable input voltage and provide a signal to the variable voltage drop device. At least the variable voltage drop device is used to dynamically adjust the output signal in response to the variation in the variable input voltage such that the output signal at the output node stays substantially constant despite the variation in the variable input voltage. In another form the signal is provided to the variable voltage drop device by providing a bias control signal to a control terminal of the variable voltage drop device. In another form an input/output voltage supply current is provided via an input/output voltage supply terminal to a second node formed by a coupling of a third terminal of the input device to a control terminal of the voltage detection device. In another form an input current is provided to a third terminal of the voltage detection device via a core voltage supply terminal. In yet another form the variable voltage drop device is configured such that a voltage drop across the variable voltage drop device increases in proportion to an increase in the variable input voltage to the input voltage circuit.

Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. It should be understood that all circuitry described herein may be implemented either in silicon or another semiconductor material or alternatively by software code representation of silicon or another semiconductor material. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms a or an, as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically.

What is claimed is:

1. An input voltage circuit comprising:
   a first input transistor having a control electrode for receiving a variable common mode input voltage;
   a first voltage detection transistor having a first current electrode coupled to a first current electrode of the first input transistor forming a first node;
   a first current source coupled to a second current electrode of the first voltage detection transistor forming a second node;
   a first variable voltage drop transistor having a first current electrode coupled to the first node, a control electrode coupled to the second node and a second current electrode coupled to a first output node, wherein the first voltage detection transistor detects a variation in the variable common mode input voltage and provides a signal to the first variable voltage drop transistor such that the first variable voltage drop transistor generates a voltage drop substantially proportional to the variation in the variable common mode input voltage to ensure a substantially constant output at the first output node;
   a second input transistor having a control electrode for receiving the variable common mode input voltage;
   a second voltage detection transistor having a first current electrode coupled to a first current electrode of the second input transistor forming a third node;
   a second current source coupled to a second current electrode of the second voltage detection transistor forming a fourth node; and
   a second variable voltage drop transistor having a first current electrode coupled to the third node, a control electrode coupled to the fourth node and a second current electrode coupled to a second output node, wherein the second voltage detection transistor detects a variation in the variable common mode input voltage and provides a signal to the second variable voltage drop transistor such that the second variable voltage drop transistor generates a voltage drop substantially proportional to the variation in the variable common mode input voltage to ensure a substantially constant output at the second output node.

2. The input voltage circuit of claim 1, wherein the second node and the fourth node are coupled to a core voltage supply terminal for an integrated circuit that includes the input voltage circuit.

3. The input voltage circuit of claim 2, wherein a fifth node is formed by a coupling of a second current electrode of the first input transistor, a control electrode of the first voltage detection transistor and a first terminal of an input/output voltage supply current source, wherein a second terminal of the input/output voltage supply current source is coupled to an input/output voltage supply terminal.

4. The input voltage circuit of claim 3, wherein a second current electrode of the second input transistor and a control electrode of the second voltage detection transistor are coupled to the fifth node.

5. The input voltage circuit of claim 3, wherein the input/output voltage supply current source comprises at least one thick-oxide transistor.

6. The input voltage circuit of claim 3, wherein the input/output voltage supply terminal is coupled to a voltage supply in a range between 1.0 volt to 3.6 volts.

7. The input voltage circuit of claim 1, wherein the first output node is coupled to a first current electrode of a first output transistor, and wherein a second current electrode of the first output transistor is coupled to a first differential output terminal of the input voltage circuit.

8. The input voltage circuit of claim 7, wherein the second output node is coupled to a first current electrode of a second output transistor, and wherein a second current electrode of the second output transistor is coupled to a second differential output terminal of the input voltage circuit.

9. The input voltage circuit of claim 8, wherein the input voltage circuit generates a differential output signal between the first differential output terminal and the second differential output terminal such that despite variations in the variable common mode input voltage the differential output signal stays within a range defined by a substantially fixed bottom range value and a top range value having a value that is within the range.

10. An input voltage circuit comprising:
    an input transistor having a control electrode for receiving a variable input voltage;
    a voltage detection transistor having a first current electrode coupled to a first current electrode of the input transistor forming a first node;
    a current source coupled to a second current electrode of the voltage detection transistor forming a second node; and
    a variable voltage drop transistor having a first current electrode coupled to the first node, a control electrode coupled to the second node and a second current electrode coupled to an output node, wherein the voltage detection transistor detects a variation in the variable input voltage and provides a signal to the variable voltage drop transistor such that the variable voltage drop transistor generates a voltage drop proportional to the variation in the variable input voltage to ensure a substantially constant output at the output node.

11. The input voltage circuit of claim 10, wherein the first node is coupled to a core voltage supply terminal for an integrated circuit that includes the input voltage circuit.

12. The input voltage circuit of claim 11, wherein a third node formed by a coupling of a second current electrode of the input transistor, a control electrode of the voltage detection transistor and a first terminal of an input/output supply voltage current source, and wherein a second terminal of the input/output supply voltage current source is coupled to an input/output voltage supply terminal.

13. The input voltage circuit of claim 12, wherein the input/output supply voltage current source comprises at least one thick-oxide transistor.

14. The input voltage circuit of claim 10, wherein the output node is coupled to a first current electrode of an output transistor, and wherein a second current electrode of the output transistor is coupled to an output terminal of the input voltage circuit.

15. The input voltage circuit of claim 10, wherein the input voltage circuit generates an output signal at the output node of the input voltage circuit such that despite variations in the variable input voltage the output signal stays substantially constant.

16. A method for providing a substantially constant output signal at an output node of an input voltage circuit, wherein the input voltage circuit comprises an input device having a first terminal for receiving a variable input voltage, a voltage detection device having a terminal coupled to a second terminal of the input device forming a first node, and a variable voltage drop device having a first terminal coupled to the first node, and a second terminal coupled to the output node, the method comprising:
    using at least the voltage detection device to detect a variation in the variable input voltage and providing a signal to the variable voltage drop device; and
    using at least the variable voltage drop device to dynamically adjust the output signal in response to the variation in the variable input voltage such that the output signal at the output node stays substantially constant despite the variation in the variable input voltage.

17. The method of claim 16, wherein providing the signal to the variable voltage drop device comprises providing a bias control signal to a control terminal of the variable voltage drop device.

18. The method of claim 16 further comprising providing an input/output voltage supply current via an input/output voltage supply terminal to a second node formed by a coupling of a third terminal of the input device to a control terminal of the voltage detection device.

19. The method of claim 16 further comprising providing an input current to a third terminal of the voltage detection device via a core voltage supply terminal.

20. The method of claim 16, wherein the variable voltage drop device is configured such that a voltage drop across the variable voltage drop device increases in proportion to an increase in the variable input voltage to the input voltage circuit.

* * * * *